United States Patent
Baumgartner et al.

(10) Patent No.: US 7,453,306 B2
(45) Date of Patent: Nov. 18, 2008

(54) PULSE SHAPING CIRCUIT

(75) Inventors: Steven J. Baumgartner, Zumbro Falls, MN (US); Brad Anthony Natzke, Rochester, MN (US)

(73) Assignee: JDS Uniphase Corporation, Milpitas, CA (US)

( * ) Notice: Subject to any disclaimer, the term of this patent is extended or adjusted under 35 U.S.C. 154(b) by 68 days.

(21) Appl. No.: 11/556,453

(22) Filed: Nov. 3, 2006

(65) Prior Publication Data

US 2007/0104232 A1  May 10, 2007

Related U.S. Application Data

(60) Provisional application No. 60/734,073, filed on Nov. 7, 2005.

(51) Int. Cl.
*H03L 5/00* (2006.01)
(52) U.S. Cl. .................. 327/307; 327/363; 327/563
(58) Field of Classification Search ............. 327/306, 327/307, 100, 559, 363, 563; 372/30
See application file for complete search history.

(56) References Cited

U.S. PATENT DOCUMENTS

| | | | |
|---|---|---|---|
| 4,182,963 A | 1/1980 | Yamada et al. | 327/179 |
| 4,268,762 A | 5/1981 | Ienaka et al. | 327/180 |
| 4,818,896 A | 4/1989 | Cavanna | 326/90 |
| 5,097,145 A | 3/1992 | Hayashi | 327/109 |
| 5,115,147 A | 5/1992 | Kusano et al. | 327/109 |
| 5,179,292 A | 1/1993 | Lee | 327/437 |
| 5,343,323 A | 8/1994 | Lynn et al. | 398/182 |
| 5,736,885 A * | 4/1998 | Wietecha et al. | 327/307 |
| 6,049,175 A | 4/2000 | Forsberg | 315/200 A |
| 6,246,268 B1 * | 6/2001 | Cheng | 327/65 |
| 6,549,054 B2 * | 4/2003 | Ono | 327/307 |
| 6,724,376 B2 | 4/2004 | Sakura et al. | 345/204 |
| 6,901,091 B2 | 5/2005 | Schrödinger | 372/26 |
| 6,933,762 B2 | 8/2005 | Ono | 327/307 |
| 6,947,456 B2 | 9/2005 | Chin et al. | 372/38.02 |

* cited by examiner

*Primary Examiner*—Dinh T. Le
(74) *Attorney, Agent, or Firm*—Allen, Dyer, Doppelt, Milbrath & Gilchrist, P.A.

(57) ABSTRACT

The invention relates to a pulse shaping circuit for shaping electrical pulses driving an optical transmitter, e.g. a lased diode or an LED, and for providing electrical pulses having independently height and width-adjustable peaking at the edges thereof. The pulse shaping circuit of the present invention includes a high-pass RC filter with a differential output for providing transient electrical pulses from an input differential pulse, an adjustable voltage offset generating circuit, a differential amplifier for adjusting the width of the transient electrical pulses in dependence on the adjustable voltage offset, and a variable-gain current-steering amplifier for producing transient pulses with independently adjustable width and height.

18 Claims, 8 Drawing Sheets

PULSE SHAPING CIRCUIT

CROSS-REFERENCE TO RELATED APPLICATIONS

The present invention claims priority from U.S. patent application Ser. No. 60/734,073 filed Nov. 7, 2005, which is incorporated herein by reference for all purposes.

TECHNICAL FIELD

The present invention relates to a pulse shaping electrical circuit, and in particular to a circuit that adds width and height adjustable peaking to pulse edges.

BACKGROUND OF THE INVENTION

There are many applications in which an optical transmitter, such as a laser diode (LD) or a light-emitting diode (LED), is driven by a pulsed electrical current to alternately switch the light source on and off, and to produce optical pulses.

Typically, it is desired that the optical pulses be of a substantially rectangular shape and follow the current pulses as closely as possible. There is, however, a time delay associated with switching the optical transmitter on or off, e.g. a time delay between an on-off transition in the drive current of the transmitter and an associated on-off transition in the light output thereof. Similarly, there is a time delay between an off-on transition in the drive current of the transmitter and an associated off-on transition in the light output thereof. This time delay can be seen as a consequence of a relatively large capacitance of a typical laser diode or light-emitting diode, which requires a certain time to be charged or discharged by the diode drive current, and/or a relatively large minority carrier life time in the active region of the diode.

The time delays associated with the laser or LED turn-on and turn-off are detrimental for higher-speed applications, e.g. when the transmitter is modulated at frequencies exceeding about 10 to 100 MHz, depending on the transmitter design. To mitigate this problem, prior-art drivers for pulsed laser diodes and LEDs often include pulse shaping circuitry that pre-shapes electrical pulses that drive the transmitters by adding a short positive peaking pulse at a leading edge of the pulses for overshooting the steady-state drive current in the diode's "on" state to kick-start the transmitter, and/or for adding a short negative or inverted peaking pulse at a trailing edge of the driving pulse to more quickly extinguish the transmitter.

Various types of such pulse shaping circuitry that adds peaking to the drive current pulses for laser diodes and LEDs have been disclosed in the past. For example, U.S. Pat. No. 4,818,896, issued to V. Cavanna, discloses a driver for an electro-optical transducer, such as an LED, which shapes current pulses so as to contain "spikes" during turn-on and turn-off in order to quickly charge and discharge the junction and stray capacitances of the LED. The driver includes a "peaking" circuit based on a differential amplifier supplying a "peaking" current to another differential amplifier functioning as a current switch supplying the drive current to the LED. A capacitor couples the amplifiers to conduct the additional current to the LED when it is initially turned on and charges the cathode of the LED. Degeneration resistors interconnecting emitters of the switching transistors couple the amplifiers to current sources and allow the amplifiers to be driven by emitter-coupled logic (ECL) gates.

Other examples of LD or LED drivers incorporating either transistor-based or purely passive peaking circuits have been disclosed. Often, the peaking circuits incorporate a differentiating RC circuit that differentiate an input voltage data pulse that is used to drive the transmitter to form positive and negative peaking voltage pulses at the rising and falling edges of the input data pulse, respectively, and then superimpose the peaking pulses to the transmitter drive current to form positive and negative current spikes at the turn-on and turn-off transitions. Examples of such drivers are disclosed in U.S. Pat. No. 5,343,323 in the names of Lynn, et al, U.S. Pat. No. 5,115,147 in the names of Kusano, et al, and U.S. Pat. No. 6,724,376 issued to Sakura, et al.

U.S. Pat. No. 6,049,175 issued to Forsberg teaches another passive arrangement for peaking the drive current of a light emitting device, e.g. an LED, upon switching it on and off. The peaking arrangement includes a passive peaking network, e.g. formed by a capacitor, a resistor, and an inductor connected in series, which is arranged in parallel with the light emitting device.

U.S. Pat. No. 6,901,091 discloses a driver for a directly-modulated semiconductor laser incorporating a peaking circuit, which comprises a transistor whose emitter terminal is connected to the semiconductor laser across a resistance and whose base current is determined by a base-emitter control voltage that exhibits positive and negative peaks according to the leading and trailing edges of the current through the semiconductor laser, whereby a constant current is generated at the transistor by means of a current mirror and modulated in correspondence with the base-emitter control voltage.

Although the aforementioned inventions appear to perform their intended functions, they provide solutions wherein the shape of the pulses produced by the laser or LED drive circuit is determined by the circuit elements and cannot be easily adjusted once a corresponding circuit board or an IC chip has been fabricated. Such drivers may therefore require extensive tuning in manufacturing. Furthermore, since different lasers and LED may have different electrical characteristics and different rise/fall characteristics associated with the laser/LED turn-on and turn-off, different driver boards and IC chips may be required to drive different output devices. Moreover, if electrical characteristics of the circuit components or the laser/LED change, new driver boards and/or new IC chips may need to be fabricated during the lifetime of the product to maintain the performance of the transmitter.

In a further disadvantage, many of the prior art pulse-shaping circuits do not discriminate between rising and falling edges of the driving electrical pulse; i.e. a peaking pulse added by the circuit to the rising edge is also added in the same magnitude to the falling edge of the driving pulse. However, some types of the optical transmitters, i.e. many types of semiconductor lasers, may require a larger peaking pulse at a rising edge of the drive current pulse than at the falling edge thereof, since lasers often require a larger turn-on pulse than a turn-off pulse.

SUMMARY OF THE INVENTION

It is therefore an object of the present invention to provide a pulse shaping circuit that produces peaking pulses having independently adjustable width and height.

It is another object of this invention to provide a pulse shaping circuit that forms independently adjustable peaking at rising and falling edges of an input electrical pulse for driving an optical transmitter.

In accordance with the invention, there is provided a pulse shaping electrical circuit for shaping an input electrical pulse signal, comprising: a first input port for receiving an input electrical pulse signal having a leading edge and a trailing edge; a first output port for providing an output electrical pulse signal to a load in response to the input electrical pulse signal, the output electrical pulse signal having a leading edge and a trailing edge corresponding to the leading and trailing edges of the input electrical pulse signal, respectively; and, a first adjustable peaking generating circuit electrically coupled between the first input and output ports. The first adjustable peaking generating circuit comprises: a first high-pass filter circuit for producing a first transient pulse signal from one of the leading and trailing edges of the input electrical pulse signal; a first tunable offset circuit coupled to the first high-pass filter for adding an adjustable voltage offset to the first transient pulse signal; and, a first differential amplifier circuit coupled to the first high-pass filter for amplifying an adjustable portion of the first transient pulse signal in dependence on the adjustable voltage offset so as to form an adjustable transient pulse signal, and for providing the adjustable transient pulse signal to the first output port, wherein the adjustable transient pulse signal has a width that is adjustable by varying the adjustable voltage offset. In operation the adjustable transient pulse signal provides adjustable positive or negative peaking at one of the leading or trailing edges, respectively, of the output electrical pulse signal.

In accordance with a preferred embodiment of the invention, the first differential amplifier circuit has a variable gain for independently adjusting the height of the adjustable transient pulse signal for providing width- and height-adjustable peaking at the one of the leading edge or the trailing edge of the output electrical pulse signal.

In accordance with another aspect of this invention, the pulse shaping electrical circuit further comprises a second high-pass filter circuit, a second variable offset circuit, and a second variable gain differential amplifier circuit for forming a second pulse and width adjustable transient pulse signal, and for forming the output electrical pulse signal with independently adjustable positive and negative peaking at the leading and trailing edges of the output pulse signal.

BRIEF DESCRIPTION OF THE DRAWINGS

The invention will be described in greater detail with reference to the accompanying drawings which represent preferred embodiments thereof, wherein.

DETAILED DESCRIPTION

The present invention may be described herein in terms of various functional components. It should be appreciated that such functional components may be realized by any number of hardware or structural components configured to perform the specified functions. For example, the present invention may employ various integrated components comprised of various electrical devices, e.g., resistors, transistors, capacitors, diodes and the like, whose values may be suitably configured for various intended purposes. Further, it should be noted that while various components may be suitably coupled or connected to other components within exemplary circuits, such connections and couplings can be realized by direct connection between components, or by connection through other components and devices. Also, for ease of explanation and understanding of the present invention, superfluous details have not been included.

An exemplary embodiment of the pulse shaping circuit according to the present invention will now be described with reference to a laser driver circuit 21 shown in FIG. 1; however, the present invention is not limited to the shown embodiment and can be used also in other applications wherein adjustable peaking may be beneficially used.

Figure 1:
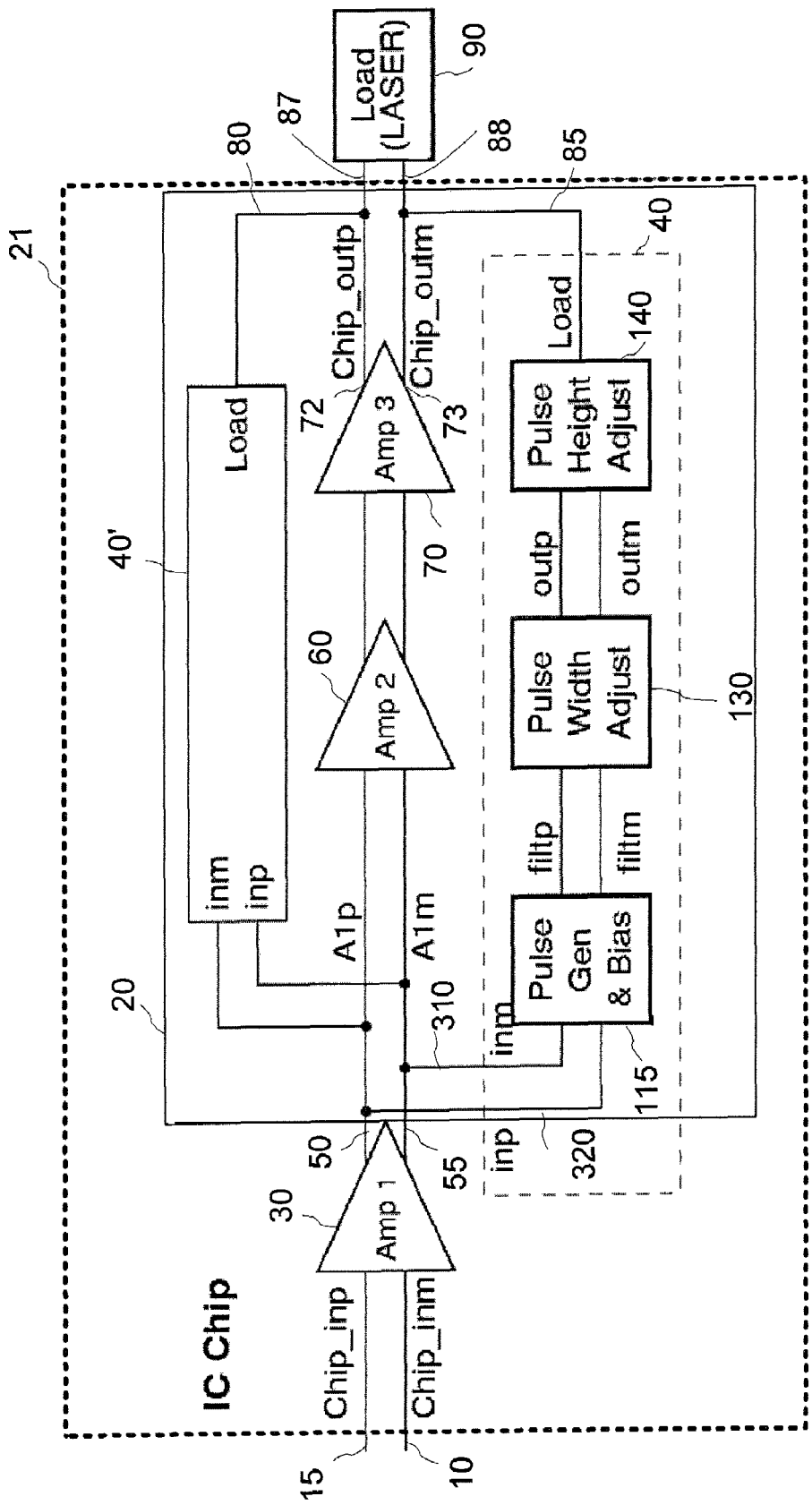
FIG. 1 is a schematic diagram of a laser driving circuit according to the present invention.

Turning now to FIG. 1, the laser driver circuit 21 for driving a load device 90, e.g. a laser diode or an LED, has single-ended input terminals 10 and 15 that connect to a differential input of a pre-amplifier 30, which in turn connects to a pulse shaping circuit 20, which includes features of the present invention. The pulse shaping circuit 20 has input terminals 50 and 55, which are connected to the differential output of the differential pre-amplifier 30 and are hereinafter together referred to as a first input port 50/55, or as a first differential input port 50/55. Single-ended output terminals 87, 88 of the pulse shaping circuit 20 also serve as the output terminals of the laser driver circuit 20, and are hereinafter together referred to as a first output port 87/88, or a first differential output port 87/88. The output terminal 87 connects to a positive terminal of the laser 90 and is therefore hereinafter also referred to as the positive output terminal, while the output terminal 88 connects to a negative terminal of the laser 90 and is therefore hereinafter also referred to as the negative output terminal of the circuit 20. In the shown embodiment, the laser driver 21 is embodied as an integrated circuit (IC) chip; in other embodiments, it can be implemented as a circuit board.

In operation, one or more data pulses in the form of complimentary single-ended signals Chip_inp and Chip_inm are fed to the laser driver 21 via the input terminals 15 and 10 of the driver 21, wherein they are first pre-amplified by the pre-amplifier 30, and then passed to the pulse shaping circuit 20 in the form of a differential signal $S_{in}=\{inp, inm\}$ having positive and negative single-ended components inp and inm, respectively; the signal $S_{in}$ is also referred to hereinafter as the input (differential) electrical pulse signal. The pulse shaping circuit 20 shapes and, optionally, amplifies the input pulse signal $S_{in}$ to produce a differential electrical pulse signal $S_{out}=\{Chip\_outp, Chip\_outm\}$ at the first output port 87/88, resulting in a current pulse $I_L$ flowing through the laser 90 in response to an input data pulse fed into the laser driver 21 via the input terminals 15, 10. Hereinafter the pulsed electrical current $I_L$, which flows through the laser 90 via the output terminals 87, 88 in response to the input differential pulse signal $S_{in}$, is referred to also as the output electrical pulse signal.

The differential signal components inp and inm represent positive, or direct, and negative, or inverted single-ended pulsed electrical signals, together forming the input differential pulse signal {inp, inm} that is provided to the pulse shaping circuit 20. Generally, these signals may include voltage components $V_{inp}$ and $V_{inm}$, and current components $I_{inp}$ and $I_{inm}$. The voltage components are pulsed voltage signals shown schematically in FIG. 2, wherein curve 104 represents a time portion of the "positive" voltage pulse signal $V_{inp}$ including a "positive" voltage pulse 114, and curve 106 represents a corresponding concurrent time portion of the "negative" voltage pulse signal $V_{inm}$, which includes a "negative", or inverted voltage pulse 116. The voltage pulses 114 and 116 result from amplification of the differential data pulse signal {Chip_inp, Chip_inm}, which can be generated, for example, digitally using digital-to-analogue converters (DACs), as would be known to those skilled in the art. Together, the voltage pulses 114 and 116 form a differential voltage pulse {114, 116}; it has a leading edge 105, and a trailing edge 115, which can also be referred to as the off-on and on-off transitions, respectively. The differential input electrical pulse signal {inp, inm} generally includes a sequence of the differential input voltage pulses {114, 116}, and a sequence of alternating on-off and off-on transitions corresponding thereto.

Figure 2:
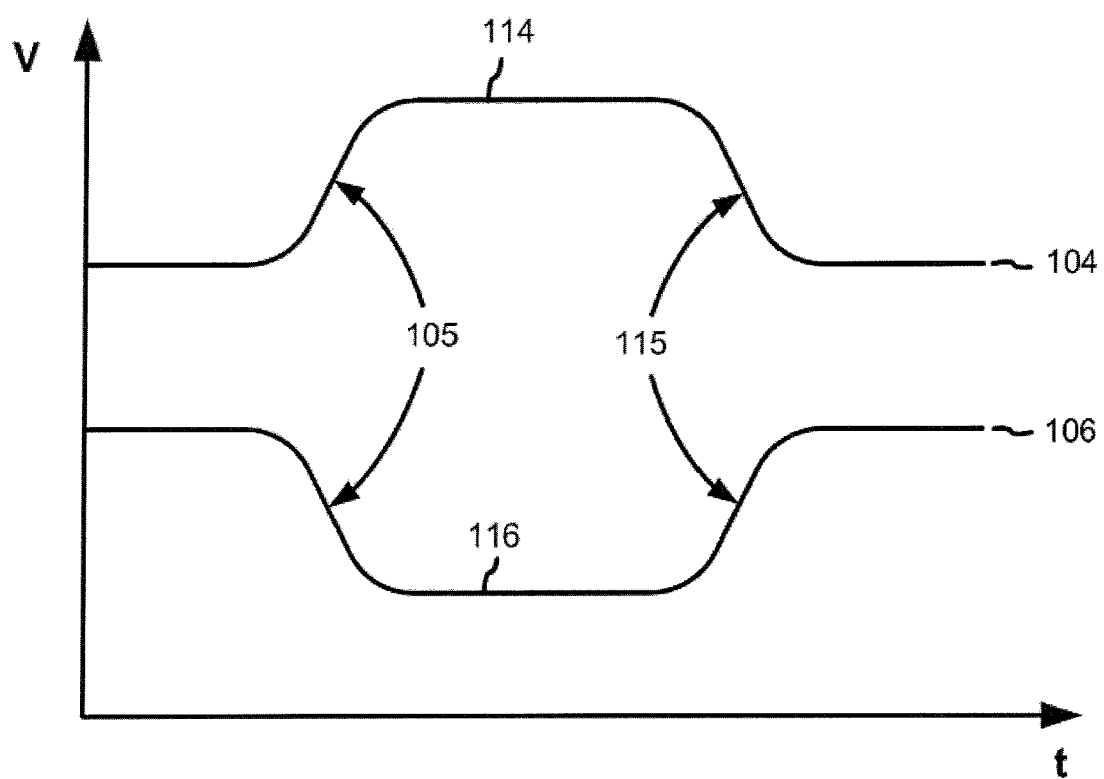
FIG. 2 is a schematic diagram of an input differential pulse signal.

Note, that during the off-on transitions, voltage components of the "positive" single-ended signals, such as $V_{inp}$ 104, increase with time, while voltage component of the "negative" single-ended signals, e.g. $V_{inm}$ 106, decrease with time. Similarly, during the on-off transitions, voltage components of the "positive" single-ended signals, such as $V_{inp}$ 104, decrease, while voltage components of the "negative" single-ended signals, e.g. $V_{inm}$ 106, rise. In the embodiment described herein, the off-on transitions may correspond to turning the laser 90 on, while the on-off transitions may correspond to turning the laser 90 off. Single-ended components of a differential signal that change in counter-phase to each other, e.g. as signals 114 and 116 in FIG. 2, are referred to herein as complimentary.

In the context of this specification, the terms "positive" and "negative", when used in relation to single-ended components of differential signals, do not imply the existence of a fixed sign relationships between said signals that is maintained at any given point in time, or the existence of a single reference signal with respect to which they are positive or negative. Herein the term "positive", when used in relation to a single-ended component of a differential signal, means that the corresponding signal is traceable to the positive terminal of the laser 90, while the term "negative" in relation to a single-ended component of a differential signal means that the corresponding signal is traceable to the negative terminal of the laser 90. Since the laser 90 in the embodiment described herein is differentially driven, common-mode components of the differential signals described in this specification are of comparatively lesser importance than the difference between the single-ended voltage components of said differential signals, e.g. the voltage difference ($V_{inp}-V_{inm}$).

Turning back to FIG. 1, the pulse shaping circuit 20 includes a cascade of two differential amplifiers 60 and 70 forming a pulse transfer circuit that is connected between the input port 50/55 and the output port 87/88 of the circuit 20, for amplifying the input electrical pulse signal $S_{in}$, and for forming an amplified differential electrical pulse signal $S_{in\_amp}$ at the output terminals 72, 73 of the output differential amplifier 70 for driving the laser 90 with the pulsed current signal IL when the later is coupled to the differential output port 87/88 of the IC 21.

The pulse shaping circuit 20 further includes an adjustable peaking generating circuit (APGC) 40, which is connected in parallel to the amplifiers 60 and 70 for producing from the input differential pulse signal {inp, inm} a negative-peaking pulse having adjustable width and height, said negative-peaking pulse hereinafter also referred to as the first adjustable transient pulse signal. The APGC 40 has a differential input 320/310, which is coupled to the first input port 50/55 of the pulse shaping circuit 20, and a single-ended output 85 that is coupled to the negative terminal 88 of the first output port 87/88, for combining the amplified electrical pulse signal $S_{in\_amp}$ at the output terminal 73 of the amplifier 70 with the first adjustable transient pulse signal from the APGC 40, so as to provide negative adjustable peaking at a trailing edge of the output pulse signal IL, which is fed by the circuit 20 to the laser 90 via the output terminals 87 and 88.

An optional APGC 40', which is generally identical to the APGC 40 but with a reversed input polarity, has a single-ended output 80 connected to the positive terminal 87 of the first output port 87/88 for adding a positive peaking pulse at a leading edge of the output pulse signal, said leading edge corresponding to the leading edge 105 of the input pulse signal $S_{in}$. The positive peaking pulse produced by the APGC 40' will also be referred to hereinafter as the second adjustable transient pulse signal.

The APGCs 40 and 40' include features of the present invention, and will hereinafter be described in sufficient detail, using the APGC 40 as an example, so to enable one skilled in the art to reproduce and practice the invention.

Figure 3A:
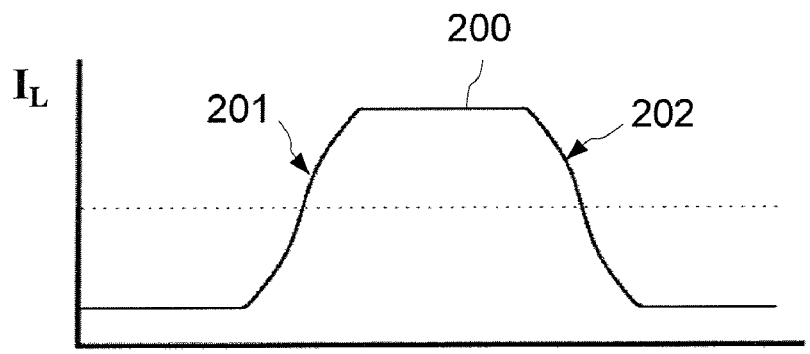
FIG. 3A is a schematic diagram of an output electrical pulse without transient peaking.
Figure 3B:
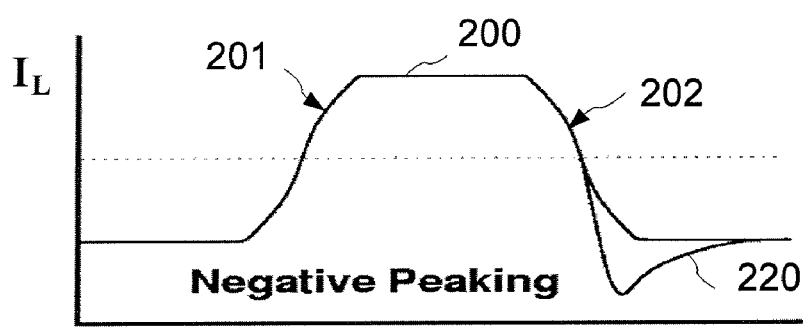
FIG. 3B is a schematic diagram of an output electrical pulse with a negative peaking at the on-off transition.
Figure 3C:
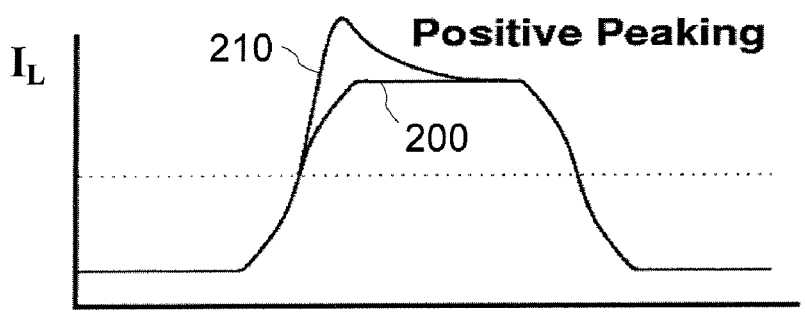
FIG. 3C is a schematic diagram of an output electrical pulse with a positive peaking at the off-on transition.
Figure 3D:
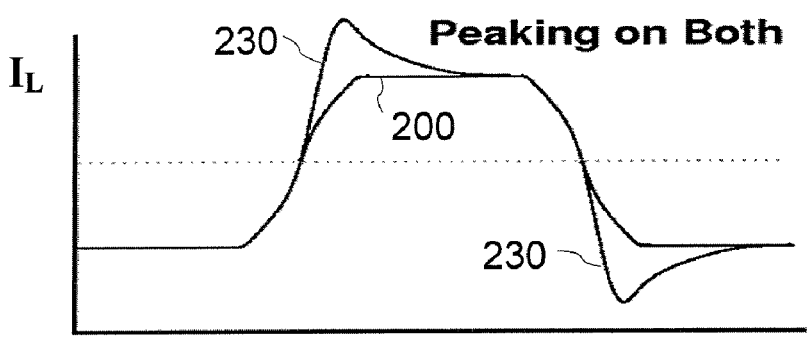
FIG. 3D is a schematic diagram of an output electrical pulse with a positive and negative peaking at the at the off-on and on-off transitions, respectively.

In operation, the APGCs 40 and 40' shape the output pulse signal $I_L$ driving the load 90 by superimposing the first and second height- and width-adjustable transient pulse signals upon the pulsed output of the amplifier 70. This is illustrated in FIGS. 3A-3D showing one current pulse of the output pulse signal $I_L$ produced by the laser driver 21 with and without the APGCs 40, 40'. FIG. 3A shows an output current pulse 200 that would have been passed through the load 90 by the circuit 20 in response to the input differential electrical pulse {114, 116} in the absence of the APGCs 40 and 40' of the present invention. The output current pulse 200 has a leading edge 201 that corresponds to the leading edge 105 of the input electrical pulse {114,116}, and a trailing edge 202 that corresponds to the trailing edge 115 of the input electrical pulse {114,116}; the leading and trailing pulse edges 201, 202 can also be referred to hereinafter as the off-on and on-off transitions of the output electrical pulse 200, respectively. FIG. 3B shows an output current pulse 220 through the load 90 that is produced by the IC 21 including the APGC 40, but without the APGC 40', wherein the negative peaking pulse produced by the APGC 40 is superimposed on the current pulse 200 at the trailing edge 202 thereof, thereby creating a negative overshoot for assisting in the laser 90 turn-off transition. FIG. 3C shows an output current pulse 210 through the load 90 that is produced by the IC 21 including the APGC 40', but without the APGC 40, wherein the positive peaking pulse produced by the APGC 40' is superimposed on the current pulse 200 at the leading edge thereof, thereby creating a positive overshoot for assisting in the laser 90 turn-on transition. Finally, FIG. 3D shows an output current pulse 230 through the load 90 that is produced by the IC 21 including both the APGC 40' and 40, wherein both the positive and negative peaking pulses produced by the APGC 40' and 40, respectively, are superimposed on the current pulse 200 for assisting both the turn-on and turn-off transitions of the laser 90.

Main structural elements and functioning of the APGC 40 in accordance with exemplary embodiments of the present invention will now be described with reference to FIGS. 4-8.

According to the invention, the APGC 40 includes the following two component circuits connected in series: a transient pulse generating circuit for generating a first transient pulse signal with adjustable voltage offset, and a first differential amplifier circuit coupled to the first transient pulse generating circuit for amplifying an adjustable portion of the first transient pulse signal in dependence on the adjustable voltage offset so as to form an adjustable transient pulse signal, and for providing the adjustable transient pulse signal to the first output port 87/88. In the exemplary embodiment shown in FIG. 1, the first of the two component circuits is represented by the electrical circuit block 115, while the second of the two component circuits is shown as including circuit blocks 130 and 140, which respectively perform the functions of adjusting the width and the height of the adjustable transient pulse signal. As described hereinbelow with reference to FIGS. 4 and 7, each of the circuits 130, 140 includes a differential transistor pair, together forming a two-stage amplifier with a variable-gain second stage. In an alternative embodiment having lower output current requirements, both the pulse width-adjustment and the height-adjustment functions can be performed using a single differential transistor pair as described hereinbelow.

Figure 4:
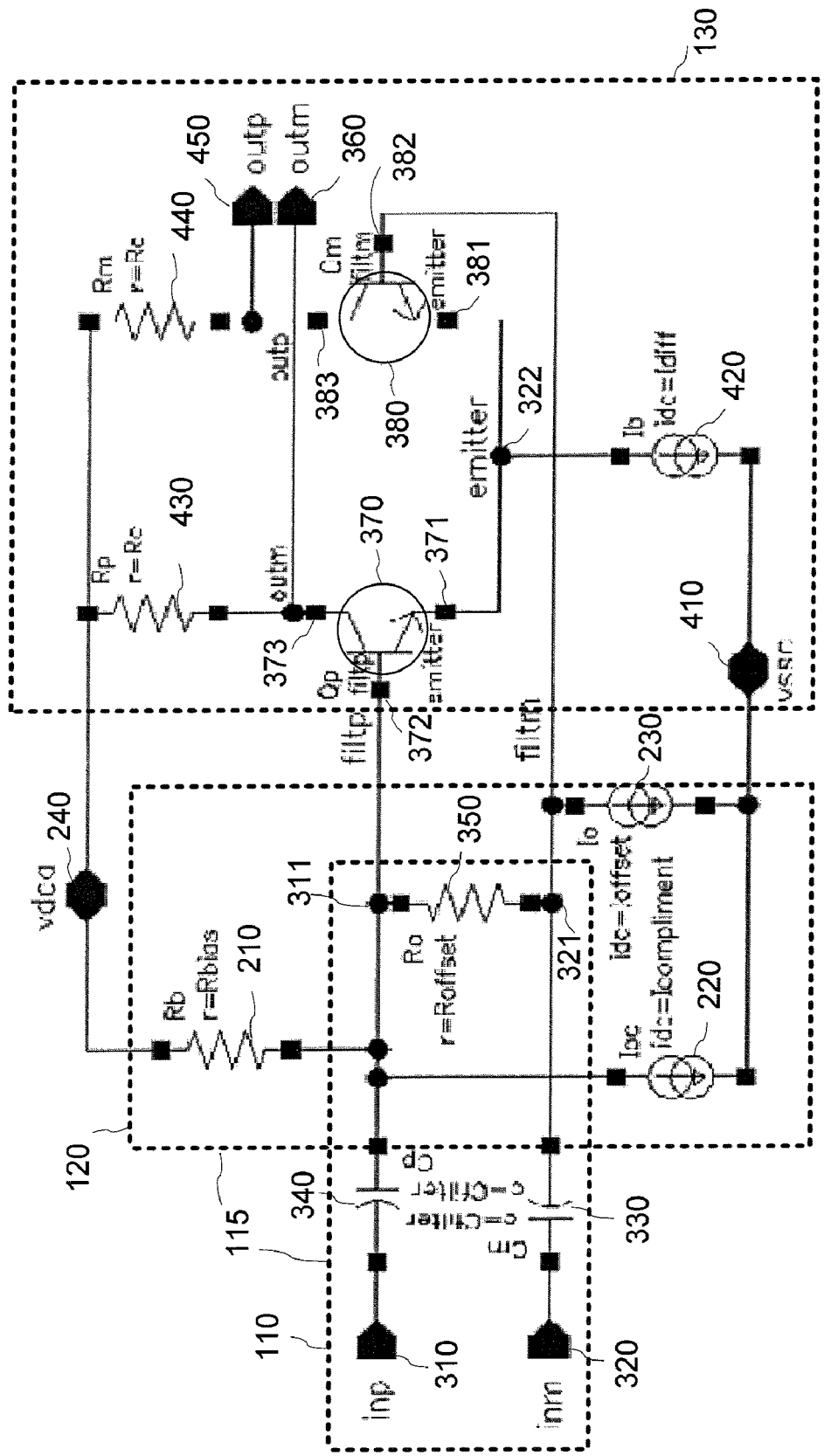
FIG. 4 is a diagram of a pulse generating and pulse width adjusting blocks of the adjustable peaking pulse generating circuit according to the present invention.
Figure 5:
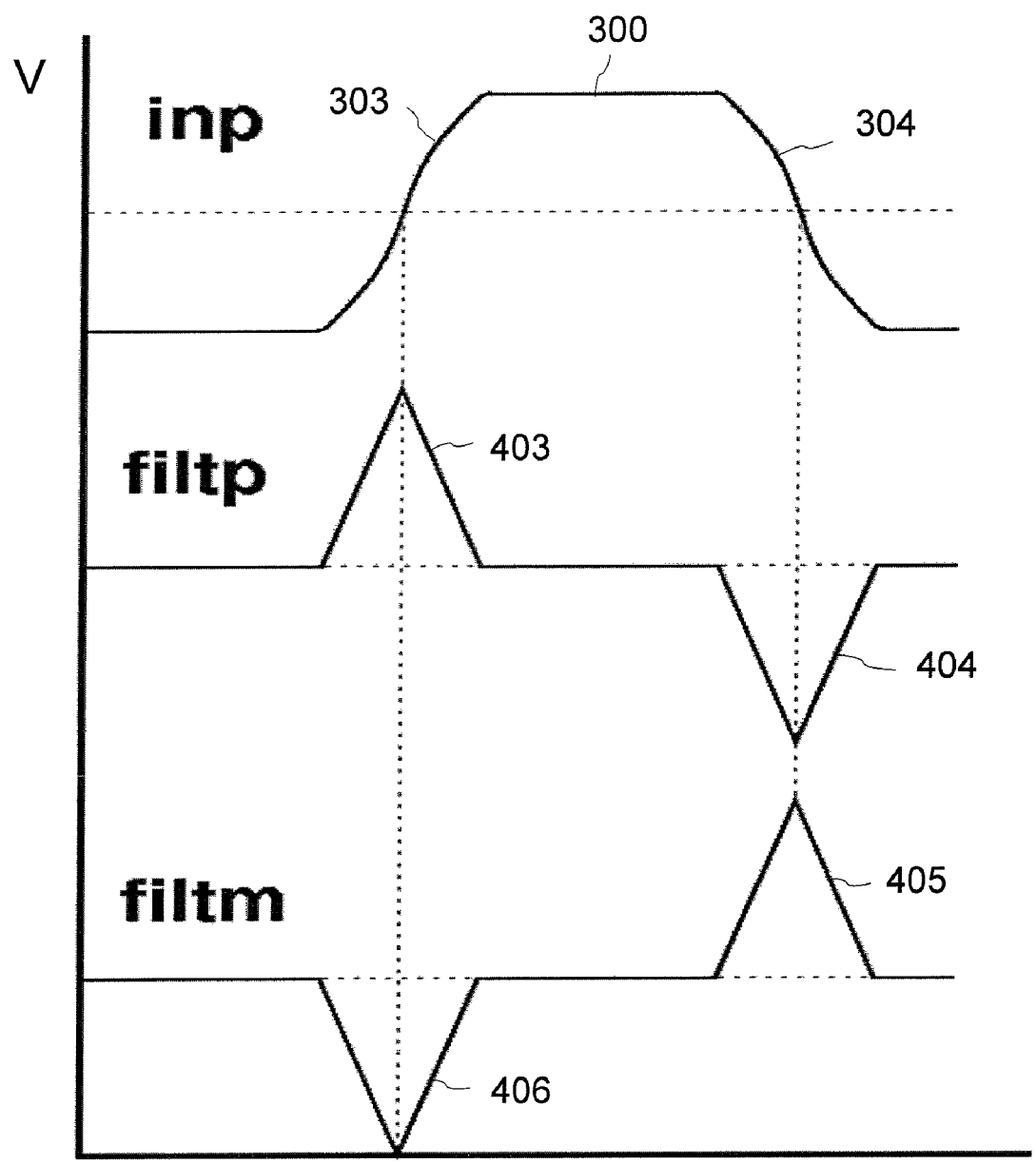
FIG. 5 is a diagram illustrating the generation of positive and negative transient voltage pulses by the first high-pass RC filter stage of the circuit shown in FIG. 3.

Turning now to FIG. 4, the transient pulse generation circuit 115 includes a high-pass filter 110 in the form of a differentiating RC circuit, and a first tunable offset circuit 120. The high-pass filter 110, also referred to hereinafter as the first high-pass filter circuit, is formed by two capacitors 330, 340 and an offset resistor 350. In operation, the positive and negative electrical pulse signals inp and inm from the output of the amplifier 30 are coupled into the input ports 310 and 320, respectively, of the high-pass filter 110, which effectively differentiates their voltage components $V_{inp}$ and $V_{inm}$ and produces single-ended signals filtp and filtm at nodes 311 and 321, respectively, forming a first differential transient pulse signal {filtp, filtm} having voltage components $V_{filtp}$ and $V_{film}$. FIG. 5 illustrates single-ended voltage signals $V_{filtp}$ 401 and $V_{filtm}$ 402 in relation to the positive input voltage pulse signal $V_{inp}$ 310; the positive signal inp includes an input voltage pulse 300 having a leading edge 303 and a trailing edge 304, said voltage pulse 300 formed at the positive input terminal 310 of the high-pass circuit 110 in response to the input pulse signal {114, 116} shown in FIG. 2. The high-pass RC circuit 110 differentiates the voltage signals $V_{inp}$ and $V_{inm}$, producing therefrom a first negative transient voltage pulse 404 and a concurrent thereto first positive transient voltage pulse 405, respectively, for the trailing pulse edge 304, and a second positive transient voltage pulse 403 and a concurrent thereto second negative transient voltage pulse 406 for the leading pulse edge 303.

Figure 7:
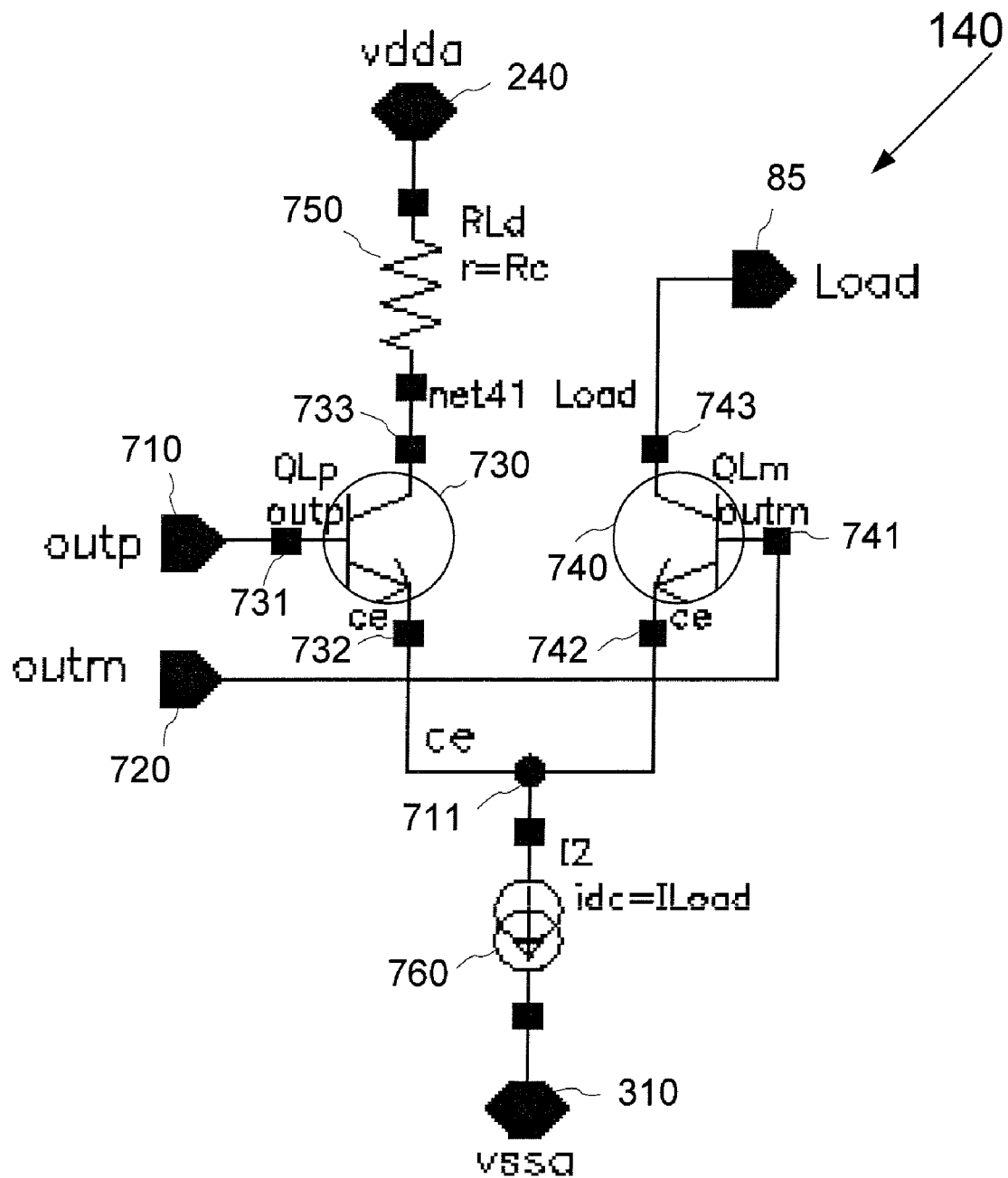
FIG. 7 is a diagram of a pulse height adjustment block of the peaking pulse generating circuit according to the present invention.

In a preferred embodiment, the voltage components $V_{inm}$ and $V_{inp}$ are complimentary as illustrated in FIG. 2, i.e. the voltage component of the pulse signal inm is representable as an inversion of the voltage component of the pulse signal inp, i.e. $V_{inm}=-V_{inp}$+constant offset, and therefore one of the signals filtp and filtm is also representable as an inversion of the other. However, this complimentary relationship is not a necessary condition for carrying out the current invention; one skilled in the art would appreciate after reading the instant specification that it would be sufficient if the first negative transient voltage pulse 404 and the first positive transient voltage pulse 405 are substantially concurrent, i.e. substantially overlap in time. By way of example, the voltage component $V_{inp}$ can have its amplitude in the range of 100 to 300 mV for bipolar transistor technology of the subsequent amplification circuits 130 and 140 (FIG. 7).

Note that the words "positive transient (voltage) pulse", in the context of this specification, are used to mean voltage pulses extending above a steady-state voltage level, and corresponding to a rising edge of an input single-ended electrical pulse signal. Similarly, the words "negative transient (voltage) pulse" are used herein to mean voltage pulses extending below the steady-state voltage level, and corresponding to a falling edge of an input single-ended electrical pulse signal. In the current embodiment, these positive and negative transient pulse signals are generated by differentiating relatively wider input pulses, e.g. the voltage pulse 300 of the pulse signal inp; they have an approximately triangular shape in the time domain, with a width substantially tapering off towards a middle time portion of the pulse, as shown in FIG. 5, and are also referred to herein as peaking pulses.

Turning back to FIG. 4, the first tunable offset circuit 120 includes the offset resistor 350 which it shared with the differentiating RC circuit 110, a bias resistor 210 connected between the "positive" node 311 of the high-pass RC circuit 110 and a power supply terminal 240 of the IC chip 21, and a first adjustable current source 230 connected between the "negative" node 321 of the high-pass RC circuit 110 and a ground connection node 410 for generating a tunable offset current $I_{offset}$. The resistors 210, 350, and the first adjustable current source 230, connected sequentially between the two constant-voltage nodes 240, 410, form a voltage bias network that provides an adjustable dc voltage offset $V_{offset}$ between the nodes 311 and 321, and therefore between the voltage pulse signals $V_{filtp}$ and $V_{filtm}$:

$$V_{offset}=I_{offset} \cdot R_{offset},$$

Figure 6A:
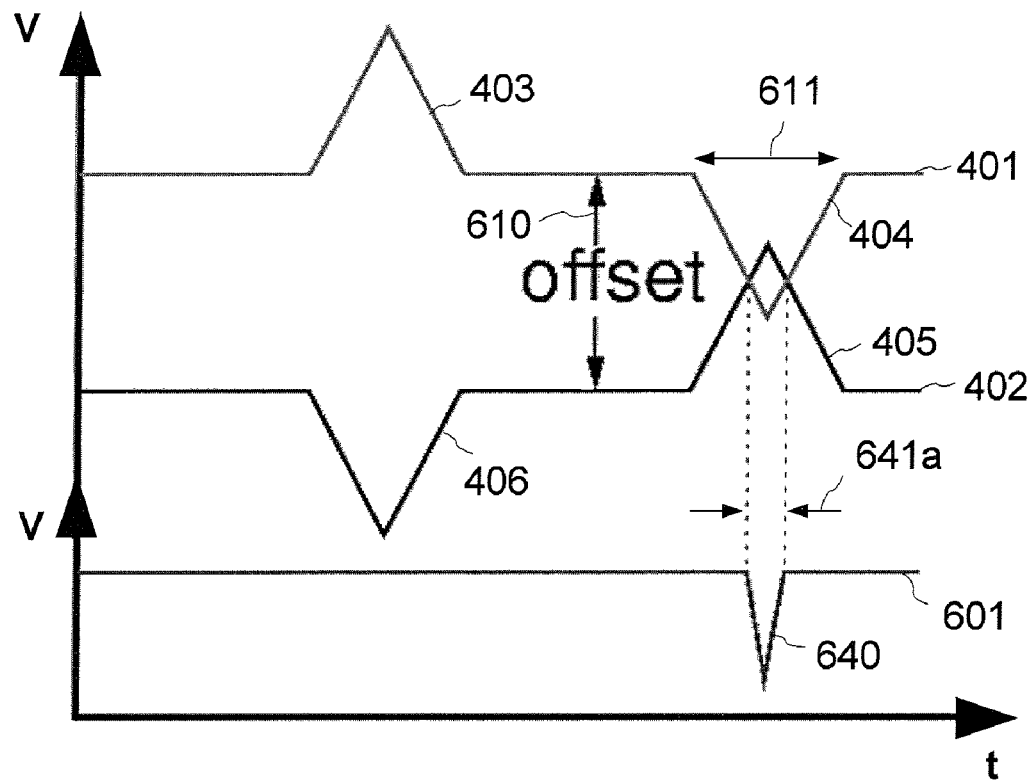
FIGS. 6A and 6B are schematic diagrams illustrating the mechanism of pulse width adjustment by tuning a dc offset voltage for the circuit shown in FIG. 3.
Figure 6B:
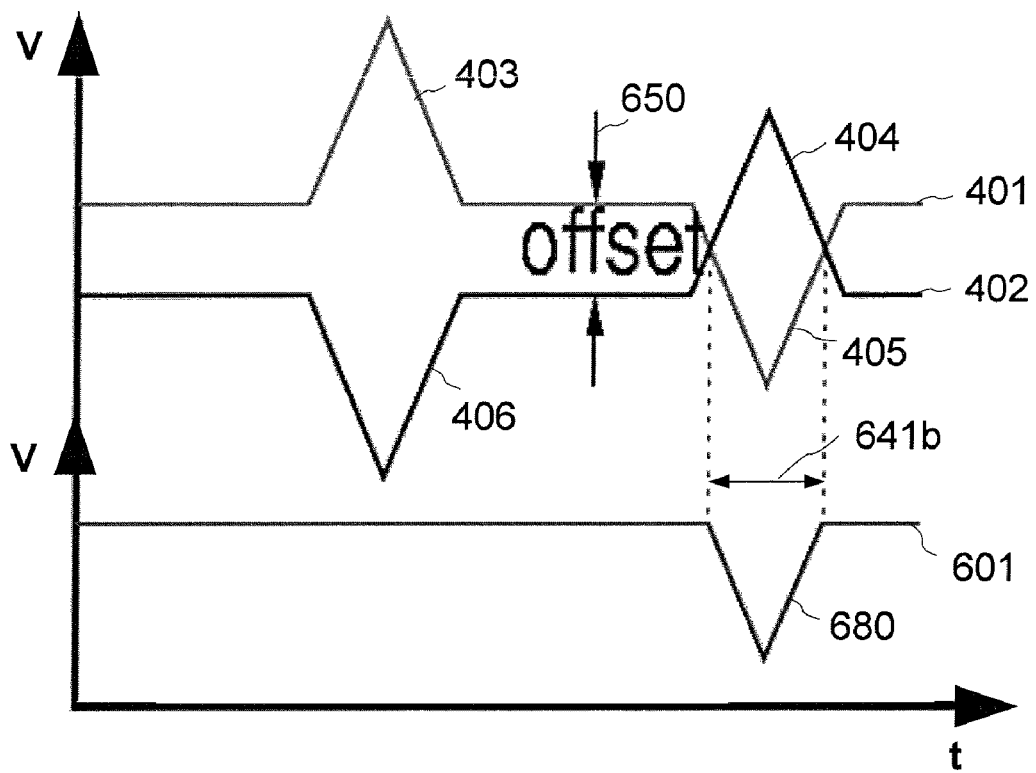

This adjustable voltage offset, which is proportional to the offset current $I_{offset}$, is schematically shown in FIGS. 6A and 6B with arrows 610 and 650.

By way of example, the resistors 210 and 350 may have nominal resistances 200 and 1000 Ohm, respectively, the capacitors 330, 340 may have nominal capacitance of 1 pF, and the current $I_{offset}$ is adjustable between 0 and 1.0 mA.

In the shown embodiment, the first tunable offset circuit 120 also includes an optional adjustable current source 220 connected between the IC ground node 410 and the positive output node 311 of the RC circuit 110, for generating a complimentary current $I_{compliment}$. Advantageously, the optional adjustable current source 220, hereinafter also referred to as the forth adjustable current source, enables maintaining a suitable dc bias voltage $V_{filtp\,dc}$ on the base 372 of a transistor 370, $$V_{filtp\,dc}=V_{vdda}-(I_{offset}+I_{compliment}) \cdot R_{bias},$$

wherein $V_{vdda}$ is the power supply voltage at the node 240, $(I_{offset}+I_{compliment})=I_{total}$, where $I_{total}$ is a constant electrical current selected for obtaining the suitable dc bias voltage $V_{filtp\,dc}$ on the base 372 of a transistor 370.

The transistor 370 is an element of the transient pulse width adjustment circuit 130, which is embodied as a first differential transistor pair formed by two npn transistors 370, 380 connected in a common emitter configuration with a common emitter node 322 and resistors 430, 440 in their collector circuits coupled to the voltage supply node 240. The transient pulse width adjustment block 130, hereinafter also referred to as the first differential amplifier circuit 130, also includes a current source 420 for generating a current $I_{diff}$ which is connected between the common emitter node 322 of the transistors 370 and 380, and the ground node 410. In the shown embodiment the resistors 430 and 440 have a same nominal resistance $R_c$. The base terminals 372, 382 of the transistors 370 and 380 form a differential input of the first differential transistor pair 130, and are connected to the output nodes 311 and 321, respectively, of the RC filter circuit 110, so that in operation the signals filtp and filtm control the base potentials of the respective transistors for alternately switching electrical current $I_{diff}$ generated by said second current source 420 between transistors 370 and 380 to flow therethrough in dependence on a polarity of the first transient pulse, as explained hereinbelow. Electrical signals outp and outm generated at nodes 383 and 373 in the collector circuits of the transistors 380 and 370, respectively, form a differential output signal {outp, outm} of the first differential transistor pair 130, which is passed via output nodes 360 and 450 to the height adjustment block 140 shown in FIG. 7. In other embodiments, the transistors 370 and 380 can be bipolar pnp transistors, or field-effect transistors, with appropriate changes to the amplifier circuit 130, as would be obvious to those skilled in the art. By way of example, the resistance $R_c$ of the resistors 430, 440, and the current $I_{diff}$ are selected together to provide about 200 mV voltage drop across said resistors, so as to adequately drive the subsequent amplifier stage 140 shown in FIG. 7. As one skill in the art will appreciate, the resistors 430, 440 are further preferably selected so as to achieve the desired high-speed performance of the amplifier 130 considering a parasitic capacitance load C on said amplifier. In particular, the resistance $R_c$ is selected to maintain the 'RC' time constant $\tau_{RC}=1/(R_c \cdot C)$ suitably small, e.g. smaller than the width of the transient pulses 403, 404, so as to not hinder the required high-frequency performance of the circuit 130. Transistors 370 and 380 are selected on the basis of the target high-frequency performance of the circuit, and of the required emitter current range determined by $I_{diff}$, as would also be known to those skilled in the art.

As stated hereinabove, the circuit blocks 110 and 130 are connected so that the signal filtp including the first negative transient pulse 404 and the second positive transient pulse 403 is coupled to the base of the transistor 370, while the signal filtm including the first positive transient pulse 405 and the second negative transient pulse 406 is coupled to the base of the transistor 380.

The first differential transistor pair 130 operates in such a way that, when the voltage $V_{filtp}$ at the base of the transistor 370 exceeds the voltage $V_{filtm}$ at the base of the transistor 380, i.e. $V_{filtp} > V_{filtm}$, the transistor 370 is closed, and most of the electrical current $I_{diff}$ generated by the current source 420 flows through the resistor 440, so that the voltage components $V_{outp}$, $V_{outm}$ of the output signals outp, outm are determined by the relationships $V_{outp} \approx V_{vdda}$, $V_{outm} \approx V_{outp} - \alpha \cdot I_{diff} \cdot R_c$, where $\alpha$ is an emitter-collector transport factor, which is typically slightly less than 1. However, when $V_{filtp} < V_{filtm}$, i.e. the relation between the base potentials of the transistors 370, 380 is reversed, most of the current $I_{diff}$ flows through the second collector resistor 430, yielding $V_{outm} \approx V_{vdda}$, $V_{outp} \approx V_{outm} - \alpha \cdot I_{diff} \cdot R_c$, wherein it is assumed for clarity that the emitter-collector transport factors of the transistor 370 is substantially equal to that of the transistor 380. As a result, the circuit 130 amplifies only a portion of the first differential transient pulse signal {filtp, filtm}, wherein the voltage component $V_{filtm}$ of the "negative" signal filtm exceeds the voltage component $V_{filtp}$ of the "positive" signal filtp, thereby producing a width-adjustable voltage pulse.

Turning to FIGS. 6A and 6B showing, for two different voltage offsets $V_{offset}$, the voltage components $V_{filtp}$ 401 and $V_{filtm}$ 402 of the signals filtp and filtm, and the differential voltage component ($V_{outp} - V_{outm}$) 601 at the output terminals 450, 360 of the first differential pair 130, one can see that for a positive voltage offset that is smaller than a total magnitude of the transient pulses 404 and 405, the relation $V_{filtp} < V_{filtm}$ is satisfied only for a portion of the first positive and negative transient pulses 404 and 405, i.e. only during a time interval 641a (FIG. 6A) or 641b (FIG. 6B) that is smaller than the width 611 of the transient pulses 404 and 405, so that the differential voltage component ($V_{outp} - V_{outm}$) 601 of the output signal pair {outp, outm} includes e.g. a negative pulse 640 having the width 641a which is generally shorter than the width 611 of the first positive and negative transient pulses 404 and 405. The width 641a (or 641b) of this negative pulse depends on the voltage offset between the signals filtp and filtm, and changes in an inverse relationship thereto: the larger the dc voltage offset $V_{offset}$, the narrower is the pulse 640. By way of example, if the dc voltage offset between the signals filtp and filtm is as large, relative to the magnitudes of the transient peaks 404, 405, as the offset 610 in FIG. 6A, only a small time portion of the transient peaks 404 and 405 within the time interval 641a is amplified by the differential amplifier 130, resulting in the narrow pulse 640 having the width 641a. Conversely, if the voltage offset is as small as the offset 650 shown in FIG. 6B, the resulting pulse 680 at the output of the amplifier 130 has the width 641b which is almost as large as the width 611 of the first positive and negative transient pulses 404, 405. In other words, the first differential transistor pair 130 amplifies a first portion of the first differential pulse signal {filtp, filtm} having a first polarity characterized by $V_{filtp} > V_{filtm}$, e.g. the portion within the time interval 641a in FIG. 6A, while substantially blocking a second portion of the first differential pulse signal having a second polarity characterized by $V_{filtp} < V_{filtm}$, e.g. the portion outside the time interval 641a in FIG. 6A, so as to form the width-adjustable voltage pulse 640.

Thus, the first differential transistor pair 130 produces the differential voltage pulse 640 having a width that is variable in dependence on the voltage offset $V_{offset}$; this pulse will also be referred to hereinafter as the width-adjustable voltage pulse 640, or simply as the width-adjustable voltage pulse.

Since the voltage offset $V_{offset}$ depends on the offset current $I_{offset}$ generated by the first adjustable current source 230, the width of the voltage pulse 640 is adjustable by adjusting the offset current $I_{offset}$. In a preferred embodiment, the first adjustable current source 230 and the optional fourth adjustable current source 220 are embodied as current digital to analog converters (DACs) controlled through an external digital interface, but could be also implemented using any controllable current sources.

In a preferred embodiment, when the current $I_{offset}$ is changed to adjust the width of the voltage pulse 640, the current $I_{compliment}$ is simultaneously adjusted by the same amount to ensure that the total current $I_{total}$ flowing through the resistor 210, $I_{total}=I_{offset}+I_{compliment}$, remains constant, thereby controlling the dc voltage at the base of the transistor 370 at an approximately constant value within an optimal operating range of the transistor 370.

Using the digital control of the DACs 230 and 220, this task can be easily accomplished, e.g. by inverting a digital bus (not shown) that controls the $I_{offset}$ DAC 230 to control the $I_{compliment}$ DAC 220. Table 1 illustrates how a single external digital control signal (first column) can be used to simultaneously control the DAC 230 (second column), and the DAC 220 (third column), so that the total current $I_{total}$ (forth column) remains constant and equivalent to a maximum current of either DAC. For the purpose of illustration only, the DACs 220 and 230 in Table 1 are assumed to be 2-bit DACs.

TABLE 1

| External | $I_{offset}$ DAC | $I_{compliment}$ DAC | $I_{total}$ |
|---|---|---|---|
| | Control Bits Format: binary (decimal) | | |
| 00 (0) | 00 (0) | 11 (3) | 3 |
| 01 (1) | 01 (1) | 10 (2) | 3 |
| 10 (2) | 10 (2) | 01 (1) | 3 |
| 11 (3) | 11 (3) | 00 (0) | 3 |

By way of example, in a circuit board embodiment of the circuit 20, the current sources 220, 230, 420 and 760 can be implemented using a commercial 8-bit current DAC model MAX5548 available from Maxim Integrated Products, Inc. In an IC embodiment of the circuit 20, the current sources 220, 230, 420 and 760 can be implemented using current mirrors and digital switches, as is known to those skilled in the art.

Turning now to FIG. 7, the differential signal {outp, outm} comprising the width-adjustable voltage pulse 640 is coupled into the pulse height adjustment circuit 140 via input terminals 710 and 720 thereof, which are coupled to the output terminals 450 and 360 of the first differential transistor pair 130, and together form the differential input of the circuit 140. The pulse height adjustment circuit 140 is embodied using a second differential transistor pair including commonly-coupled transistors 730 and 740 forming a variable gain amplification stage. More particularly, in the shown embodiment the circuit 140 is a single-ended current-steering amplifier based on a pair of npn transistors 730, 740 connected in a common-emitter configuration. The base terminals 731 and 741 of the transistors 730 and 740 are coupled to the differential input port 710/720 of the circuit 140, so that the base voltages of the transistors 730 and 740 are determined by the voltage components $V_{outp}$ and $V_{outm}$ of the signals outp and outm, said signals thereby also controlling the emitter-collector conductivities of the transistors 730 and 740. A third adjustable current source 760 is connected between the ground node 410 and the common emitter node 711 of the transistors 730, 740 for providing an adjustable current $I_{Load}$ to the emitter connectors 732, 742 of the transistors 730 and 740. The collector connector 733 of the transistor 730 is coupled to the power supply node 240 via a resistor 750, while the collector connector 743 of the transistor 740 is directly coupled to the single-ended output connector 85 of the APGC 40 for supplying a transient current pulse signal to the load 90.

Similarly to the collector currents of the transistors 370 and 380 in the aforedescribed differential amplifier 130, the collector currents of the transistors 730 and 740 in the current-steering amplifier 140 are controlled by two factors: a relative relationship between the transistor base voltages $V_{outp}$ and $V_{outm}$, and a magnitude of the common emitter current $I_{Load}$ generated by the third adjustable current source 760. When $V_{outp}$ is higher than $V_{outm}$, the transistor 730 is turned on and the transistor 740 is turned off. In this condition, the current $I_{Load}$ is diverted to flow through the transistor 730, while substantially no current flows via the transistor 740 to the output node 85 towards the load 90.

Figure 8:
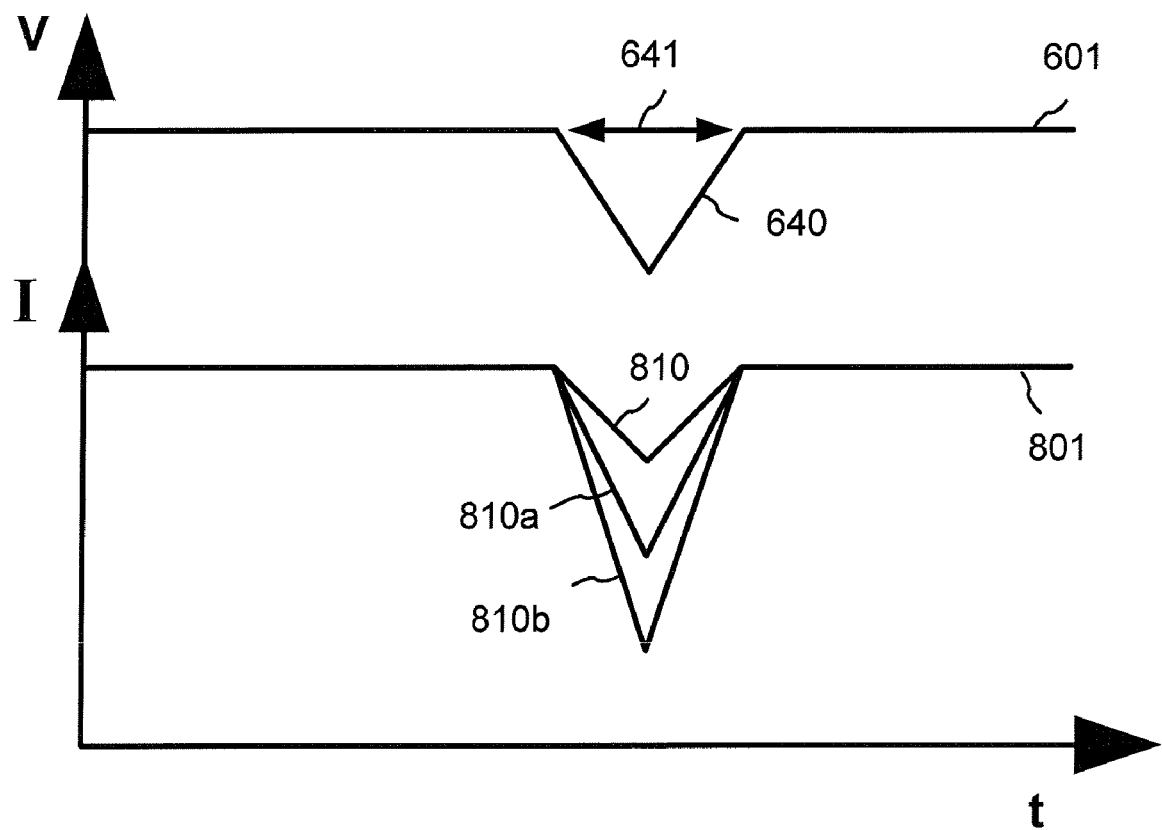
FIG. 8 is a schematic diagram illustrating the pulse height adjustment by adjusting the variable bias current $I_{load}$ generated by the tunable bias current source shown in FIG. 6.

With reference to FIG. 8, which shows the peaking electrical current signal 801 generated at the single-ended output port 85 in response to the differential voltage $(V_{outp}-V_{outm})$ 601 at the input terminals 710, 720 of the second differential pair 140, only when the voltage $V_{outp}$ drops below $V_{outm}$, i.e. only during the time interval when the width-adjustable transient voltage pulse 640 is formed at the input terminals 710, 720, will any significant portion of the current $I_{Load}$ be transferred to the load 90. Therefore, the variable-gain amplification stage 140 operates to produce, via its output port 85, a current pulse 810 having a width determined by the width 641 of the width-adjustable voltage pulse 640, and a magnitude $\alpha I_{Load} \sim I_{Load}$ controlled by the adjustable current source 760. This negative adjustable current pulse 810 corresponds to the trailing edge 304 of the pulse signal {inp, inm} received by the circuit 110, i.e. to the on-off transition in the input signal, and will be hereinafter also referred to as the first adjustable transient pulse. To illustrate adjusting the height of the adjustable transient pulse 810 by controlling the third adjustable current source 760, FIG. 8 schematically shows three instances of said first adjustable transient pulse signal 810, labeled with reference labels "810", "810*a*", and "810*b*", which result from adjusting the third current source 760 to supply a dc current equal to $I_{Load}$, $2 \cdot I_{Load}$, and $3 \cdot I_{Load}$, respectively. The third adjustable current source 760 is preferably implemented as a DAC that is controlled by an external digital signal, but can also be any suitable current source, controlled internally or externally.

By way of example, the resistor 750 has a nominal resistance matching that of the output resistor of the differential amplifier 70, 50 Ohms typically, and the current $I_{Load}$ provided by the adjustable current source 760 is variable in the range of 0 to 20 mA for providing a peak output current up to 20 mA for the output transient pulse width in the range of 5-20 ps; the transistors 730 and 740 are selected or fabricated so that their high-frequency performance is suitable for proving the short output transient pulses, and to support the generation of the 20 mA peaking current in their emitter-collector circuits.

The single-ended output 85 of the APGC 40 connects to the negative output node 73 of the output amplifier 70, which in turn connects to the load 90 as shown in FIG. 1; the amplified electrical pulse signal 200 (FIGS. 3A, 3B) produced by the amplifier 70 and the first width and height adjustable transient pulse signal 810 are thereby combined so as to form the output electrical pulse signal 220 shown in FIG. 3B. An output impedance of the amplifier 70, which in one embodiment is determined by a resistor in an output collector circuit of the amplifier 70, and the load 90 provide a necessary termination to the single-ended output 85 of the first APGC 40. When the load 90 can be considered as a pure resistor, the output electrical pulse generated by the circuit 21 can be described as being either a current pulse or a voltage pulse.

Note that care has to be taken to ensure that electrical time delays associated with the amplifiers 60 and 70, and with the APGC 40 are substantially equal to each other, so that the height- and width-adjustable transient pulse 810 is aligned with the on-off transition 202 of the amplified electrical pulse 200 at the output of the amplifier 70.

As described hereinbefore with reference to FIG. 1, in the shown embodiment the width and height adjustment of the first transient pulse signal 810 is performed in two separate amplification stages 130, 140, which together are referred to herein as the first differential amplifier circuit 130, 140. In other embodiments, e.g. when the required output current pulse is relatively small in amplitude, e.g. not exceeding a few mA, both these functions, i.e. the adjustment of the width and height of the peaking pulse 810, can be performed using a single differential transistor pair configured to form the single-ended current-steering amplifier as shown in FIG. 7. In these embodiments, the constant-gain differential circuit 130 can be eliminated, so that the output nodes 311, 321 of the high-pass filter circuit 110 are directly coupled to the differential input 710/720 of the variable-gain amplification circuit 140, which in this case alone forms the first differential amplifier circuit that receives the first differential transient signal {filtp, filtm} having the adjustable voltage offset, and outputs the first negative transient pulse signal 810 having independently adjustable width and height. Equivalently, the second differential amplification stage 140 can be eliminated, while the first differential transistor pair 130 can be reconfigured to form a variable-gain current-steering amplifier with a single-ended output as shown in FIG. 7, e.g. by making the second current source 420 adjustable to provide adjustable current, and directly coupling one of the terminals 360 and 450 to the single-ended output port 85 removing the corresponding collector resistor to de-couple said terminal from the supply node 240.

The optional APGC 40' is included together with the APGC 40 in the IC chip 20 of the present invention in some embodiments thereof, for forming a second pulse and width adjustable transient pulse signal at the off-on transition 201 of the output electrical pulse 200, to form the output pulse signal 230 with independently-adjustable peaking at both the on-off and off-on transitions thereof. In a preferred embodiment, the APGC 40' includes a second high-pass filter circuit, a second variable offset circuit, and a second variable gain differential amplifier having a differential input and a single-ended output 80, which are not shown and are identical to the first high-pass filter circuit 110, the first variable offset circuit 120, and the first differential amplifier, e.g. the two-stage amplifier 130, 140, respectively, of to the one-stage embodiment thereof as described hereinabove. The input polarity of the APGC 40' is however reversed compared to the input polarity of the APGC 40, as schematically indicated in FIG. 1 using labels "inm" and "inp" at the input terminals of the APGC block 40'. Turning back to FIGS. 6A and 6B, this polarity reversal would lead to the reversal of a relative position of signals filtp 401 and filtm 402 with respect to the vertical voltage axis, so that the transient peaks 404 and 405 at the trailing edge of the pulse 300 now diverge, while the transient peaks 403 and 406 at the leading edge 303 of the input pulse 300 converge and partially overlap in the voltage domain, switching the polarity of the differential pulse signal {filtp, filtm} within a portion of the time interval of the transient pulse {403, 406}, said polarity defined by the sign of the voltage difference ($V_{filtp}-V_{filtm}$). This switching of the polarity of the differential signal {filtp, filtm} during the leading edge 303 of the input pulse results in the formation of the second adjustable transient pulse signal from the leading edge of the input electrical pulse signal by the rest of the APGC 40' circuitry, as described hereinabove with respect to the formation of the first pulse-and width-adjustable transient pulse signal 810 by the APGC 40, providing a positive peaking pulse at the leading edge 201 of the output pulse 200. Note that identical APGC circuits 40 and 40' having the reverse input polarity would generate at their outputs peaking current pulses of a same polarity but at different time instances, i.e. corresponding to the trailing and leading edges of the input electrical pulse signal; connecting the output ports of the circuits 40 and 40' to the opposite-polarity terminals of the laser 90 results in a negative peaking at one of the edges of the output pulse, and a positive peaking at the other of the edges of output current pulse through the laser 90.

The present invention enables one printed circuit board or one IC chip 21 to drive many different kinds of output devices, such as lasers or light-emitting diodes. In particular, semiconductor lasers that operate in the 850 nm wavelength range have different rise/fall characteristics than semiconductor lasers operating in the 1310 nm or 1550 nm wavelength ranges, requiring therefore different amplitudes of the transient current pulse for a same transient pulse width. On the other hand, directly modulated semiconductor lasers that operate at, e.g. 1 Gb/s data pulse rate, may require wider transient current pulses than lasers operating in the 4 Gb/s pulse rate for a same pulse amplitude. Also, some type of lasers may require a higher transient pulse amplitude for the rising edge of the data pulse than for the falling edge thereof, since it is generally easier to shut off a laser than it is to turn it on.

Of course numerous other embodiments may be envisioned without departing from the spirit and scope of the invention.

We claim:

1. A pulse shaping electrical circuit comprising:
    a first input port for receiving an input electrical pulse signal having a leading edge and a trailing edge;
    a first output port for providing an output electrical pulse signal to a load in response to the input electrical pulse signal, the output electrical pulse signal having a leading edge and a trailing edge corresponding to the leading and trailing edges, respectively, of the input electrical pulse signal; and,
    a first adjustable peaking generating circuit electrically coupled between the first input and output ports, comprising:
        a first high-pass filter circuit for producing a first transient pulse signal from one of the leading and trailing edges of the input electrical pulse signal;
        a first tunable offset circuit coupled to the first high-pass filter for adding an adjustable voltage offset to the first transient pulse signal; and,
        a first differential amplifier circuit coupled to the first high-pass filter for amplifying an adjustable portion of the first transient pulse signal in dependence on the adjustable voltage offset so as to form an adjustable transient pulse signal, and for providing the adjustable transient pulse signal to the first output port;
        wherein the adjustable transient pulse signal has a width that is adjustable by varying the adjustable voltage offset, and wherein in operation the adjustable transient pulse signal provides adjustable peaking at one of the leading edge or the trailing edge of the output electrical pulse signal; and,
    a pulse transfer circuit electrically coupled between the first input and output ports in parallel to the first adjustable peaking generating circuit, and comprising one or more differential amplifiers for amplifying the input electrical pulse signal.

2. A pulse shaping electrical circuit according to claim 1, wherein the first differential amplifier circuit is for amplifying only a portion of the first transient pulse signal exceeding in voltage a threshold value, wherein said portion is adjustable in width by varying the adjustable voltage offset.

3. A pulse shaping electrical circuit according to claim 1, wherein the input and output ports are differential and wherein the input electrical pulse signals comprises two single-ended pulse signals.

4. A pulse shaping electrical circuit according to claim 3, wherein the output port comprises negative and positive terminals, and wherein the first adjustable peaking generating circuit has a differential input electrically coupled to the first input port and a single-ended output electrically coupled to one of the positive and negative terminals of the first output port for providing the positive or negative adjustable peaking at the one of the leading and trailing edges of the output pulse signal.

5. A pulse shaping electrical circuit according to claim 4, further comprising a second adjustable transient peak generating circuit having a differential input coupled to the first input port and a single-ended output coupled to the other of the positive and negative terminals of the first output port for providing independently adjustable peaking at the other of the leading and trailing edges of the output pulse signal.

6. A pulse shaping electrical circuit according to claim 4, wherein:
the first transient pulse signal is differential comprising two complimentary single-ended transient pulse signals, and
the first high-pass filter circuit comprises an offset resister electrically coupled between two capacitors so as to form a differentiating RO circuit for producing the two complimentary single-ended transient pulses at the end terminals of the offset resister from the one of the leading and trailing edges of the input electrical pulse signal.

7. A pulse shaping electrical circuit according to claim 6, wherein
the first tunable offset circuit comprises a first adjustable current source for providing an adjustable offset current through the offset resister for adding the adjustable voltage offset to the first transient pulse for changing a polarity of a portion of the first transient pulse signal.

8. A pulse shaping electrical circuit according to claim 6, wherein the first adjustable current source comprises a current digital to analog converter for adjusting the offset current by a digital control signal.

9. A pulse shaping electrical circuit according to claim 6, wherein the first differential amplifier circuit comprises:
a first differential transistor pair having a differential input coupled to the end terminals of the offset resistor for receiving the first transient pulse signal, wherein said first differential transistor pair is commonly coupled to a second current source for alternately switching electrical current generated by said second current source between transistors of the first differential transistor pair to flow therethrough in dependence on the polarity of the first transient pulse.

10. A pulse shaping electrical circuit according to claim 9, wherein the polarity of the first transient pulse is inverted for a fraction of said pulse duration that is adjustable by adjusting the adjustable voltage offset, and wherein the first differential amplifier circuit is for amplifying said fraction of the first transient pulse signal, and for substantially blocking the remainder thereof for controlling the width of the first adjustable transient pulse signal.

11. A pulse shaping electrical circuit according to claim 10, wherein the second current source is adjustable for controlling the height of the first adjustable transient pulse.

12. A pulse shaping electrical circuit according to claim 11, wherein the second current source comprises a digitally controlled current digital to analog converter.

13. A pulse shaping electrical circuit according to claim 10, wherein:
the first differential transistor pair has a differential output, and
the first differential amplifier includes a second differential transistor pair having a differential input coupled to the differential output of the first differential transistor pair and a single-ended output forming the single-ended output of the first adjustable peaking generating circuit.

14. A pulse shaping electrical circuit according to claim 13, wherein the second differential transistor pair is commonly connected to a third current source for steering electrical current generated by said third current source to the single-ended output of the first adjustable peaking generating circuit in response to a signal received from the differential output of the first differential transistor pair for forming the first adjustable transient pulse signal.

15. A pulse shaping electrical circuit according to claim 14, wherein the third current source is adjustable for controlling the height of the first adjustable transient pulse whereby providing height-adjustable peaking at the one of the leading or trailing edges of the output pulse signal.

16. A pulse shaping electrical circuit according to claim 14, wherein the third current source comprises a digitally controlled current digital to analog converter.

17. A pulse shaping electrical circuit according to claim 9 further comprising a supply voltage node and a ground node,
wherein the first differential transistor pair comprises commonly connected first and second transistors having first and second base electrodes electrically coupled to the terminals of the offset resistor,
further comprising a bias circuit connected between the supply voltage node and the ground node and comprising a bias resister connected in series with a fourth adjustable current source for providing a complimentary electrical current through the bias resister,
said bias circuit coupled to the first base electrode for maintaining a pre-defined bias voltage thereon when the adjustable voltage offset is changed.

18. A pulse shaping electrical circuit according to claim 17, wherein the first and fourth adjustable current sources comprise a first and second digital to analog converters, respectively, which are controlled for complimentary adjusting the offset electrical current and the complimentary electrical current using a digital control signal so as to maintain the sum of the offset and complimentary electrical currents at a constant value.

* * * * *